(12) United States Patent
Wurmsdobler et al.

(10) Patent No.: US 12,384,406 B2
(45) Date of Patent: Aug. 12, 2025

(54) SYSTEMS FOR TESTING AND TRAINING AUTONOMOUS VEHICLES

(71) Applicant: FIVE AI LIMITED, Bristol (GB)

(72) Inventors: Peter Wurmsdobler, Cambridge (GB); Jonathan Forshaw, Berkhamsted (GB)

(73) Assignee: Five AI Limited, Cambridge (GB)

( * ) Notice: Subject to any disclaimer, the term of this patent is extended or adjusted under 35 U.S.C. 154(b) by 255 days.

(21) Appl. No.: 18/008,110

(22) PCT Filed: May 27, 2021

(86) PCT No.: PCT/EP2021/064281
§ 371 (c)(1),
(2) Date: Dec. 2, 2022

(87) PCT Pub. No.: WO2021/244955
PCT Pub. Date: Dec. 9, 2021

(65) Prior Publication Data
US 2023/0331247 A1    Oct. 19, 2023

(30) Foreign Application Priority Data
Jun. 3, 2020  (GB) .................................. 2008368

(51) Int. Cl.
*B60W 60/00* (2020.01)
*B60W 50/14* (2020.01)
(Continued)

(52) U.S. Cl.
CPC .......... *B60W 60/001* (2020.02); *B60W 50/14* (2013.01); *G01C 21/3614* (2013.01); *G05B 13/027* (2013.01); *B60W 2520/00* (2013.01)

(58) Field of Classification Search
CPC .......... B60W 60/001; B60W 60/0011; B60W 50/14; G06F 30/20; G08G 5/0069;
(Continued)

(56) References Cited

U.S. PATENT DOCUMENTS

| 2004/0186662 A1* | 9/2004 | Morie | G01C 21/367 |
| | | | 701/532 |
| 2010/0174483 A1* | 7/2010 | Kim | G01C 21/3614 |
| | | | 701/532 |

(Continued)

FOREIGN PATENT DOCUMENTS

WO    2020064955 A1    4/2020

OTHER PUBLICATIONS

Mercy Tim et al: "Spline-Based Motion Planning for Autonomous Guided Vehicles in a Dynamic Environment", IEEE Transactions On Control Systems Technology, vol. 26, No. 6, Nov. 1, 2018 (Nov. 1, 2018), pp. 2182-2189 (Year: 2018).*

(Continued)

*Primary Examiner* — Yuri Kan
(74) *Attorney, Agent, or Firm* — Andrew J. Tibbetts; Samuel S. Stone; Greenberg Traurig, LLP

(57) ABSTRACT

A computer implemented method of path verification in a computer system is described. A user provides input to mark a displayed image of a scenario. A path is generated representing the trajectory of a vehicle. Control points along the path are recorded, each control point associated with a vehicle position and target speed. A vehicle position end target speed of two control points is used to calculate at least one path verification parameter which defines how a vehicle travelling along the path would behave. The at least one verification parameter is compared with a corresponding threshold value; and an alert is generated to the user at the user interface when the at least one path verification parameter exceeds the corresponding threshold value.

20 Claims, 7 Drawing Sheets

(51) Int. Cl.
   *G01C 21/36*   (2006.01)
   *G05B 13/02*   (2006.01)

(58) Field of Classification Search
   CPC .. H05B 45/10; G05D 1/0246; G01C 21/3614; G01C 21/367
   See application file for complete search history.

(56) References Cited

U.S. PATENT DOCUMENTS

| | | | |
|---|---|---|---|
| 2016/0313133 A1* | 10/2016 | Zeng | B60W 60/0011 |
| 2016/0334796 A1* | 11/2016 | Inoue | G05D 1/0246 |
| 2019/0021152 A1* | 1/2019 | Matsuo | H05B 45/10 |
| 2019/0221128 A1* | 7/2019 | Guo | G08G 5/0069 |
| 2019/0354643 A1* | 11/2019 | Shum | G06F 30/20 |

OTHER PUBLICATIONS

PCT/EP2021/064281; International Search Report; Sep. 6, 2021; By: Authorized officer: Bozas, Ioannis.

Florent Altch\'e et al., "High-Speed Trajectory Planning for Autonomous Vehicles Using a Simple Dynamic Model", arxiv.org, Cornell University Library, 201 Olin Library Cornell University Ithaca, NY 14853,Apr. 4, 2017 (Apr. 4, 2017).

Mercy Tim et al, "Spline-Based Motion Planning for Autonomous Guided Vehicles in a Dynamic Environment", US Nov. 1, 2018 (Nov. 1, 2018), vol. 26, No. 6, p. 2182-2189.

\* cited by examiner

SYSTEMS FOR TESTING AND TRAINING AUTONOMOUS VEHICLES

CROSS-REFERENCE TO RELATED APPLICATIONS

This application is the U.S. National Stage application, pursuant to 35 U.S.C. § 371, of PCT International Patent Application No. PCT/EP2021/064281, filed May 5, 2021, designating the European Patent Office and published in English, which claims priority under 35 U.S.C. §§ 119 and 365 to Great Britain Patent Application No. 2008368.9, filed Jun. 3, 2020. The contents of each of the aforementioned applications are incorporated herein by reference in their entirety.

TECHNICAL FIELD

The present disclosure relates to computer systems for testing and training autonomous vehicles, and methods of operation of such computer systems.

BACKGROUND

There have been major and rapid developments in the field of autonomous vehicles. An autonomous vehicle is a vehicle which is equipped with sensors and control systems which enabled it to operate without a human controlling its behaviour. An autonomous vehicle is equipped with sensors which enable it to perceive its physical environment, such sensors including for example cameras, radar and lidar. Autonomous vehicles are equipped with suitably programmed computers which are capable of processing data received from the sensors and making safe and predictable decisions based on the context which has been perceived by the sensors. There are different facets to testing the behaviour of the sensors and control systems aboard a particular autonomous vehicle, or a type of autonomous vehicle.

Sensor processing may be evaluated in real-world physical facilities. Similarly, the control systems for autonomous vehicles may be tested in the physical world, for example by repeatedly driving known test routes, or by driving routes with a human on-board to manage unpredictable or unknown contexts.

Physical world testing will remain an important factor in the testing of autonomous vehicles capability to make safe and predictable decisions. However, physical world testing is expensive and time-consuming. Increasingly there is more reliance placed on testing using simulated environments. If there is to be an increase in testing in simulated environments, it is desirable that such environments can reflect as far as possible real-world scenarios. Autonomous vehicles need to have the facility to operate in the same wide variety of circumstances that a human driver can operate in. Such circumstances can incorporate a high level of unpredictability.

It is not viable to achieve from physical testing a test of the behaviour of an autonomous vehicle in all possible scenarios that it may encounter in its driving life. Increasing attention is being placed on the creation of simulation environments which can provide such testing in a manner that gives confidence that the test outcomes represent potential real behaviour of an autonomous vehicle.

For effective testing in a simulation environment, the autonomous vehicle under test (the ego vehicle) has knowledge of its location at any instant of time, understands its context (based on simulated sensor input) and can make safe and predictable decisions about how to navigate its environment to reach a pre-programmed destination.

Simulation environments need to be able to represent real-world factors that may change in the road layout in which it is navigating. This can include weather conditions, road types, road structures, junction types etc. This list is not exhaustive, as there are many factors that may affect the operation of an ego vehicle.

The present disclosure addresses the particular challenges which can arise in simulating the behaviour of actors in the simulation environment in which the ego vehicle is to operate. Such actors may be other vehicles, although they could be other actor types, such as pedestrians, animals, bicycles et cetera.

A simulator is a computer program which when executed by a suitable computer enables a sensor equipped vehicle control module to be developed and tested in simulation, before its physical counterpart is built and tested. A simulator provides a sensor simulation system which models each type of sensor with which the autonomous vehicle may be equipped. A simulator also provides a three-dimensional environmental model which reflects the physical environment that an automatic vehicle may operate in. The 3-D environmental model defines at least the road network on which an autonomous vehicle is intended to operate, and other actors in the environment. In addition to modelling the behaviour of the ego vehicle, the behaviour of these actors also needs to be modelled.

Simulators generate test scenarios (or handle scenarios provided to them). As already explained, there are reasons why it is important that a simulator can produce many different scenarios in which the ego vehicle can be tested. Such scenarios can include different behaviours of actors. The large number of factors involved in each decision to which an autonomous vehicle must respond, and the number of other requirements imposed on those decisions (such as safety and comfort as two examples) mean it is not feasible to write a scenario for every single situation that needs to be tested. Nevertheless, attempts must be made to enable simulators to efficiently provide as many scenarios as possible, and to ensure that such scenarios are close matches to the real world. If testing done in simulation does not generate outputs which are faithful to the outputs generated in the corresponding physical world environment, then the value of simulation is markedly reduced.

Scenarios may be created from live scenes which have been recorded in real life driving. It may be possible to mark such scenes to identify real driven paths and use them for simulation. Test generation systems can create new scenarios, for example by taking elements from existing scenarios (such as road layout and actor behaviour) and combining them with other scenarios. Scenarios may additionally or alternatively be randomly generated.

However, there is an increasingly a requirement to tailor scenarios for particular circumstances such that particular sets of factors can be generated for testing. It is desirable that such scenarios may define actor behaviour.

SUMMARY

The present inventors have augmented scenario generation by providing feedback to a user who is creating a scenario as to whether or not the scenario which they are creating would, when executed in a simulation environment, provide a scenario in which the one or more agent was behaving within kinematic and dynamic constraints of a real vehicle traversing a similar scenario in a real world environment.

The present inventors have also noted that such feedback is useful in the context of annotation tools which are used to annotate scenarios for the purpose of training planners used in autonomous vehicles.

According to one aspect of the present disclosure there is provided a computer implemented method of path verification in a computer system having a user interface configured to display an image to a user and to detect user input for marking the image to generate a path, the method comprising:

receiving user input at the user interface to mark a displayed image of a scenario;
generating a path representing the trajectory of a vehicle;
recording in a computer memory control points along the path, each control point associated with a vehicle position and target speed;
in a processor, calculating from the vehicle position end target speed of two adjacent control points at least one path verification parameter which defines how a vehicle travelling along the path would behave;
comparing the at least one verification parameter with a corresponding threshold value; and
generating an alert to the user at the user interface when the at least one path verification parameter exceeds the corresponding threshold value.

In one application of the method, it may be used in a computer system for generating a scenario to be run in a simulation environment for testing the behaviour of an autonomous vehicle. The step of receiving user input may comprise receiving at an editing interface of the computer system user input for marking multiple locations to create the path. The step of generating the path may comprise generating at least one path which passes through the multiple locations. The path does not need to pass through all of the multiple locations. The multiple locations may be used to interpolate a smoothed path which may pass through none, some or all of the multiple locations. Control points which correspond to the marked locations by the user, or may be control points on the interpolated path which may be close to but not correspond exactly to the marked locations.

The interpolated path may be rendered in the image which is displayed at the user interface.

The method may comprise receiving user input defining adaptation data for path verification. The adaptation data may be selected from vehicle type specific data, such as vehicle wheel base and maximum steering angle, and driving comfort related data such as maximum turn rate, maximum lateral acceleration and maximum longitudinal acceleration. The adaptation data may be stored in suitable computer storage.

At least one observation may be generated for at least one location on the path, when the at least one path verification parameter exceeds its corresponding threshold value. That corresponding threshold value may be for example a maximum turn rate, lateral acceleration or longitudinal acceleration when considering driving comfort, or a maximum steering angle when considering vehicle type specific data. The observation may be stored in suitable computer storage and may be used to cause the alert.

The path verification parameter may be selected from longitudinal acceleration, lateral acceleration, curvature, steering angle and turn rate.

The two control points may be adjacent control points, or there may be other control points along the path.

In another application of the path verification, the step of receiving user input may comprise receiving annotation input from a user at the user interface for annotating a scene captured by the vehicle in a real-world environment. The path may be generated from scene data. In one situation, the user may be annotating motion of vehicles in a video captured by the vehicle in the real-world environment, the video being rendered on the user interface to enable the user to mark the path.

In another application, the path may be generated from time sequence scenes captured by the vehicle in a real-world environment, the scenes being used to enable a user to annotate each scene.

Another aspect of the disclosure provides a computer implemented method of path verification in a computer system having a user interface configured to display an image to a user and to detect user input for marking the image to generate a path, the method comprising:

receiving user input at the user interface to mark a displayed image of a scenario;
generating a path representing the trajectory of a vehicle;
recording in a computer memory control points along the path, each control point associated with a vehicle position and target speed;
in a processor, calculating from the vehicle position end target speed of two control points at least one path verification parameter which defines how a vehicle travelling along the path would behave;
comparing the at least one verification parameter with a corresponding threshold value; and
automatically modifying the path if the threshold value is exceeded so that the threshold value is not exceeded by the modified path.

In this case, the system automatically modifies the path if the threshold value is exceeded so that the threshold value is not exceeded by the modified path. This may be used in addition to or instead of alerting the user.

Another aspect of the disclosure provides a computer system comprising:

a user interface configured to receive user input to mark a displayed image of a scenario;
a path generation module configured to generate a path representing the trajectory of a vehicle;
a computer memory in which are recorded control points along the path, each control point associated with a vehicle position and target speed;
a processor configured to carry out the operations of:
calculating from the vehicle position and target speed of two control points at least one path verification parameter which defines how a vehicle travelling along the path would behave; and
comparing the at least one verification parameter with a corresponding threshold value; the processor further configured to carry out at least one of:
generating an alert to the user at the user interface when the at least one path verification parameter exceeds the corresponding threshold value, and
automatically modifying the path if the threshold value is exceeded so that the threshold value is not exceeded by the modified path.

A further aspect provides a computer program product comprising computer code stored on a computer readable medium which when executed by a computer carries out the steps of any of the predefined methods.

DETAILED DESCRIPTION

Figure 1:
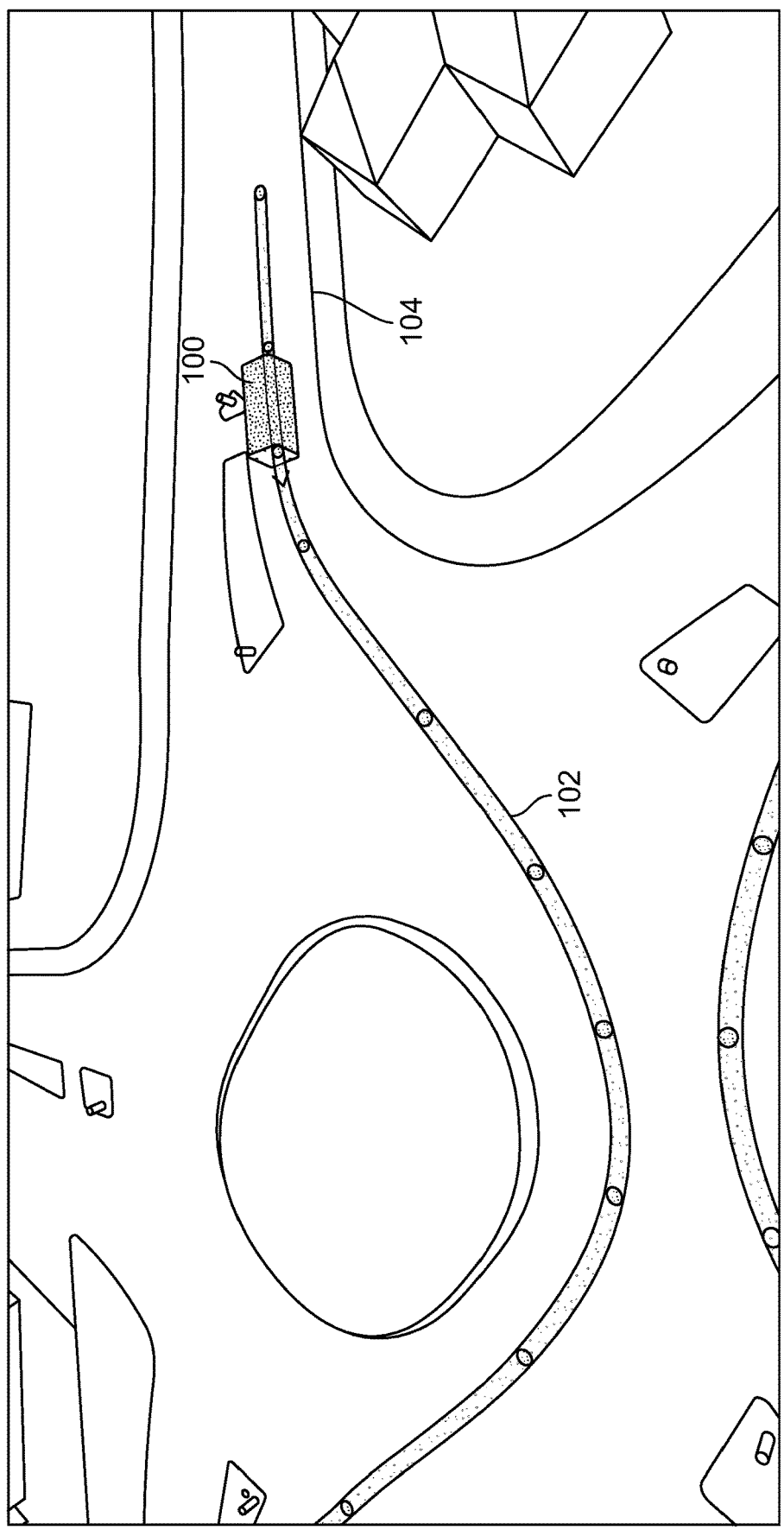
FIG. 1 illustrates a display of a user interface on which a path has been marked by a user.

It is necessary to define scenarios which can be used to test the behaviour of an ego vehicle in a simulated environment. Scenarios are defined and edited in offline mode, where the ego vehicle is not controlled, and then exported for testing in the next stage of a testing pipeline which is described below.

While it is useful to be able to create a wide variety of scenarios by editing, it is beneficial to have a way of eliminating non useful scenarios prior to simulation/testing. When creating scenario descriptions that will be used in testing/simulation it is useful to determine if, prima facie, agents in simulated or playback scenarios are operating within constraints that would be imposed on a physical vehicle in the real world. For example, if a real vehicle could not negotiate a tight turn at a certain speed in real life, it is useful to avoid generating scenarios for simulation in which such behaviour is exhibited by a simulated vehicle.

A scenario comprises one or more agents (sometimes referred to as actors) travelling along one or more paths in a road layout. A road layout is a term used herein to describe any features that may occur in a driving scene, and in particular includes at least one track along which a vehicle is intended to travel in a simulation. That track may be a road or lane or any other driveable path. A road layout is displayed in a scenario to be edited as an image on which paths may be marked. Agents may comprise non-ego vehicles or other road users such as cyclists and pedestrians. The scene may comprise one or more road features such as roundabouts or junctions. These agents are intended to represent real-world entities encountered by the ego vehicle in real-life driving situations. The present description allows the user to modify the motion of these agents to present more challenging conditions to the ego vehicle for testing.

The present description relates to a path verification system which enables a path to be tested for adherence to kinematic and dynamic physical constraints. One use of a path verification process and system is in an editing system having a scenario builder to extract and create abstract or concrete scenarios to obtain a large verification set for testing the ego vehicle. New test cases can be created on newly created or imported scenarios by creating, moving or re-ordering agents within the scene. Path parameters such as speeds and starting positions of agents can be user defined and/or altered, and agent paths can be repositioned to adjust the complexity of a scenario as it will be presented to an ego vehicle.

As described more fully herein, an existing scenario can be downloaded from a scenario database 508 for editing, for example a road layout scene of a junction such as a roundabout. The scene can be inspected and run in a playback mode of the editing system to identify what changes may be needed. Editing is carried out in an offline mode where the ego vehicle is not controlled in playback. In one example use case the ego vehicle's entry window into the roundabout is reduced in the scene by re-ordering agent (actor) vehicles in the scene. This may be achieved in an editing mode by assigning behaviours to an agent vehicle on a path displayed in the scene. The path may be repositioned in the scene by allowing the editor user to select one or more marked locations on the path and reposition them on the display. The behaviour may include an adaptive cruise control behaviour to control speed and distance between multiple agent vehicles on the same path. The editing system enables a user to switch from editing mode to playback mode to observe the effect of any changes they have made to the scenario.

Before further describing the editing system, a simulation system and its purpose will be described. Path parameters and/or behaviour parameters assigned during editing are used as motion data/behaviour data in a simulation as described below.

Figure 6:
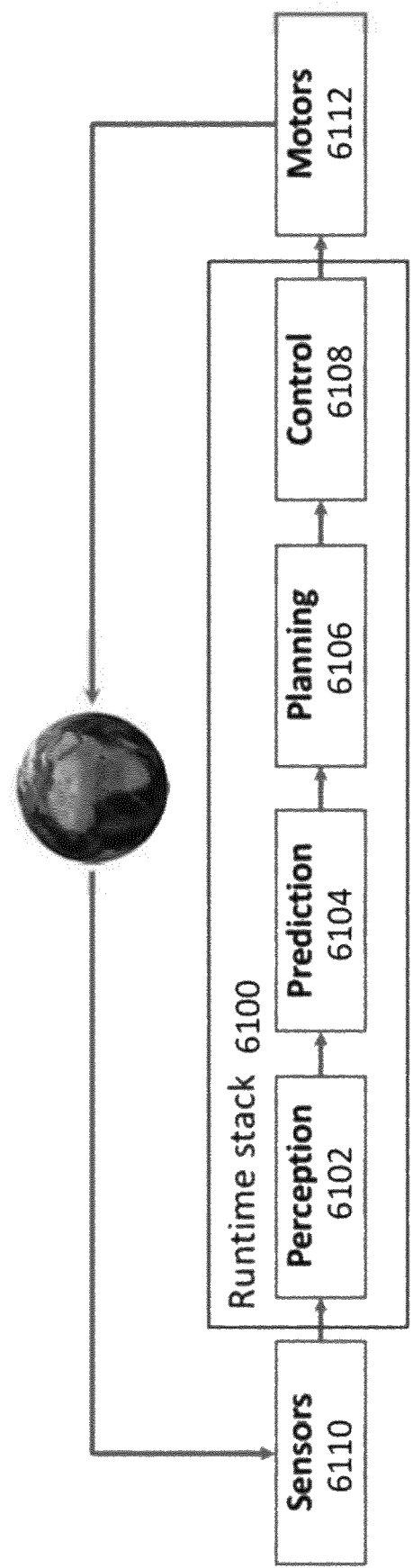
FIG. 6 is a schematic block diagram of a runtime stack for an autonomous vehicle.

FIG. 6 shows a highly schematic block diagram of a runtime stack 6100 for an autonomous vehicle (AV), also referred to herein as an ego vehicle (EV). The run time stack 6100 is shown to comprise a perception system 6102, a prediction system 6104, a planner 6106 and a controller 6108.

In a real-world context, the perception system 6102 would receive sensor outputs from an on-board sensor system 6110 of the AV and uses those sensor outputs to detect external agents and measure their physical state, such as their position, velocity, acceleration etc. The on-board sensor system 6110 can take different forms but generally comprises a variety of sensors such as image capture devices (cameras/optical sensors), LiDAR and/or RADAR unit(s), satellite-positioning sensor(s) (GPS etc.), motion sensor(s) (accelerometers, gyroscopes etc.) etc., which collectively provide rich sensor data from which it is possible to extract detailed information about the surrounding environment and the state of the AV and any external actors (vehicles, pedestrians, cyclists etc.) within that environment. The sensor outputs typically comprise sensor data of multiple sensor modalities such as stereo images from one or more stereo optical sensors, LiDAR, RADAR etc. Stereo imaging may be used to collect dense depth data, with LiDAR/RADAR etc. proving potentially more accurate but less dense depth data. More generally, depth data collection from multiple sensor modalities may be combined in a way that preferably respects their respective levels of uncertainty (e.g. using Bayesian or non-Bayesian processing or some other statistical process etc.). Multiple stereo pairs of optical sensors may be located around the vehicle e.g. to provide full 360° depth perception.

The perception system 6102 comprises multiple perception components which co-operate to interpret the sensor outputs and thereby provide perception outputs to the prediction system 6104. External agents may be detected and represented probabilistically in a way that reflects the level of uncertainty in their perception within the perception system 6102.

In a simulation context, depending on the nature of the testing—and depending, in particular, on where the stack 6100 is sliced—it may or may not be necessary to model the on-board sensor system 6100. With higher-level slicing, simulated sensor data is not required therefore complex sensor modelling is not required.

The perception outputs from the perception system 6102 are used by the prediction system 6104 to predict future behaviour of external actors (agents), such as other vehicle in the vicinity of the AV.

Predictions computed by the prediction system 6104 are provided to the planner 6106, which uses the predictions to make autonomous driving decisions to be executed by the AV in a given driving scenario. A scenario is represented as a set of scenario description parameters used by the planner 6106. A typical scenario would define a drivable area and would also capture predicted movements of any external agents (obstacles, from the AV's perspective) within the drivable area. The driveable area can be determined using perception outputs from the perception system 6102 in combination with map information, such as an HD (high-definition) map.

A core function of the planner 6106 is the planning of trajectories for the AV (ego trajectories) taking into account predicted agent motion. This may be referred to as maneuver planning. A trajectory is planned in order to carry out a desired goal within a scenario. The goal could for example be to enter a roundabout and leave it at a desired exit; to overtake a vehicle in front; or to stay in a current lane at a target speed (lane following). The goal may, for example, be determined by an autonomous route planner (not shown).

The controller 6108 executes the decisions taken by the planner 6106 by providing suitable control signals to an on-board actor system 6112 of the AV. In particular, the planner 6106 plans manoeuvres to be taken by the AV and the controller 6108 generates control signals in order to execute those manoeuvres.

Figure 7:
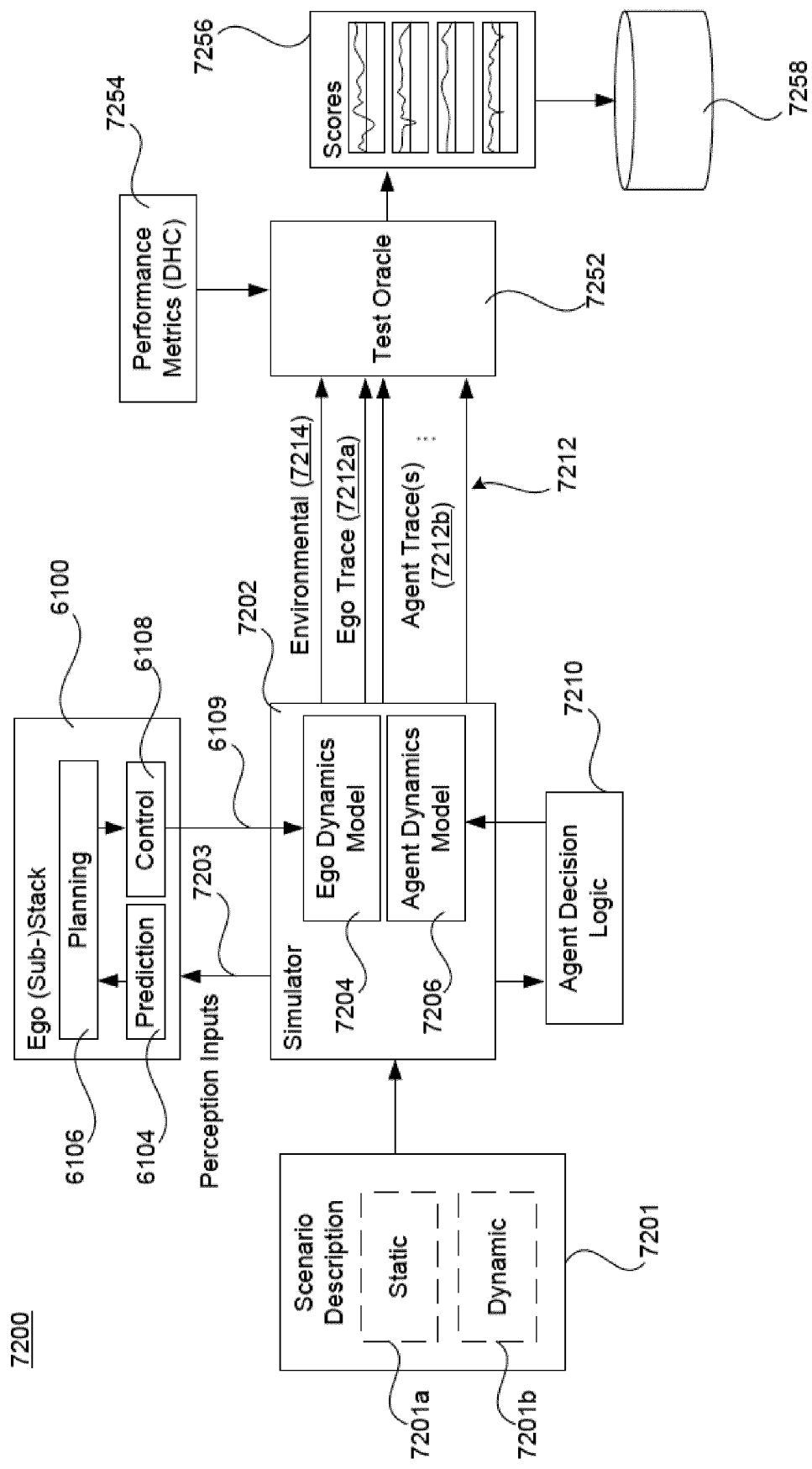
FIG. 7 is a schematic block diagram of a testing pipeline.

FIG. 7 shows a schematic block diagram of a testing pipeline 7200. The testing pipeline 7200 is shown to comprise a simulator 7202 and a test oracle 7252. The simulator 7202 runs simulations for the purpose of testing all or part of an AV run time stack.

By way of example only, the description of the testing pipeline 7200 makes reference to the runtime stack 6100 of FIG. 1 to illustrate some of the underlying principles by example. As discussed, it may be that only a sub-stack of the run-time stack is tested, but for simplicity, the following description refers to the AV stack 6100 throughout; noting that what is actually tested might be only a subset of the AV stack 6100 of FIG. 1, depending on how it is sliced for testing. In FIG. 2, reference numeral 6100 can therefore denote a full AV stack or only sub-stack depending on the context.

FIG. 7 shows the prediction, planning and control systems 6104, 6106 and 6108 within the AV stack 6100 being tested, with simulated perception inputs 7203 fed from the simulator 7202 to the stack 6100. However, this does not necessarily imply that the prediction system 6104 operates on those simulated perception inputs 7203 directly (though that is one viable slicing, in which case the simulated perception inputs 7203 would correspond in form to the final outputs of the perception system 6102). Where the full perception system 6102 is implemented in the stack being tested (or, at least, where one or more lower-level perception components that operate on raw sensor data are included), then the simulated perception inputs 7203 would comprise simulated sensor data.

The simulated persecution inputs 7203 are used as a basis for prediction and, ultimately, decision-making by the planner 6108. The controller 6108, in turn, implements the planner's decisions by outputting control signals 6109. In a real-world context, these control signals would drive the physical actor system 6112 of AV. The format and content of the control signals generated in testing are the same as they would be in a real-world context. However, within the testing pipeline 7200, these control signals 6109 instead drive the ego dynamics model 7204 to simulate motion of the ego agent within the simulator 7202.

To the extent that external agents exhibit autonomous behaviour/decision making within the simulator 7202, some form of agent decision logic 7210 is implemented to carry out those decisions and drive external agent dynamics within the simulator 7202 accordingly. The agent decision logic 7210 may be comparable in complexity to the ego stack 6100 itself or it may have a more limited decision-making capability. The aim is to provide sufficiently realistic external agent behaviour within the simulator 7202 to be able to usefully test the decision-making capabilities of the ego stack 6100. In some contexts, this does not require any agent decision making logic 7210 at all (open-loop simulation), and in other contexts useful testing can be provided using relatively limited agent logic 7210 such as basic adaptive cruise control (ACC). Similar to the ego stack 6100, any agent decision logic 7210 is driven by outputs from the simulator 7202, which in turn are used to derive inputs to the agent dynamics models 7206 as a basis for the agent behaviour simulations.

A simulation of a driving scenario is run in accordance with a scenario description 7201, having both static and dynamic layers 7201*a*, 7201*b*.

The static layer 7201*a* defines static elements of a scenario, which would typically include a static road layout.

The dynamic layer 7201*b* defines dynamic information about external agents within the scenario, such as other vehicles, pedestrians, bicycles etc. The extent of the dynamic information provided can vary. For example, the dynamic layer 7201*b* may comprise, for each external agent, a spatial path to be followed by the agent together with one or both motion data and behaviour data associated with the path.

In simple open-loop simulation, an external actor simply follows the spatial path and motion data defined in the dynamic layer that is non-reactive i.e. does not react to the ego agent within the simulation. Such open-loop simulation can be implemented without any agent decision logic 7210.

However, in "closed-loop" simulation, the dynamic layer 7201*b* instead defines at least one behaviour to be followed along a static path (such as an ACC behaviour). In this, case the agent decision logic 7210 implements that behaviour within the simulation in a reactive manner, i.e. reactive to the ego agent and/or other external agent(s). Motion data may still be associated with the static path but in this case is less prescriptive and may for example serve as a target along the path. For example, with an ACC behaviour, target speeds may be set along the path which the agent will seek to match, but the agent decision logic 7210 might be permitted to reduce the speed of the external agent below the target at any point along the path in order to maintain a target headway from a forward vehicle.

The output of the simulator 7202 for a given simulation includes an ego trace 7212*a* of the ego agent and one or more agent traces 7212*b* of the one or more external agents (traces 7212).

A trace is a complete history of an agent's behaviour within a simulation having both spatial and motion components. For example, a trace may take the form of a spatial path having motion data associated with points along the path such as speed, acceleration, jerk (rate of change of acceleration), snap (rate of change of jerk) etc.

Additional information is also provided to supplement and provide context to the traces 7212. Such additional information is referred to as "environmental" data 7214 which can have both static components (such as road layout) and dynamic components (such as weather conditions to the extent they vary over the course of the simulation).

To an extent, the environmental data 7214 may be "passthrough" in that it is directly defined by the scenario description 7201 and is unaffected by the outcome of the simulation. For example, the environmental data 7214 may include a static road layout that comes from the scenario description 7201 directly. However, typically the environmental data 7214 would include at least some elements derived within the simulator 7202. This could, for example, include simulated weather data, where the simulator 7202 is free to change whether change weather conditions as the simulation progresses. In that case, the weather data may be time-dependent, and that time dependency will be reflected in the environmental data 7214.

The test oracle 7252 receives the traces 7212 and the environmental data 7214, and scores those outputs against a set of predefined numerical performance metrics to 7254. The performance metrics 7254 encode what may be referred to herein as a "Digital Highway Code" (DHC). Some examples of suitable performance metrics are given below.

The scoring is time-based: for each performance metric, the test oracle 7252 tracks how the value of that metric (the score) changes over time as the simulation progresses. The test oracle 7252 provides an output 7256 comprising a score-time plot for each performance metric.

The metrics 7256 are informative to an expert and the scores can be used to identify and mitigate performance issues within the tested stack 6100.

Scenarios for use by a simulation system as described above may be generated in a scenario builder.

Figure 5:
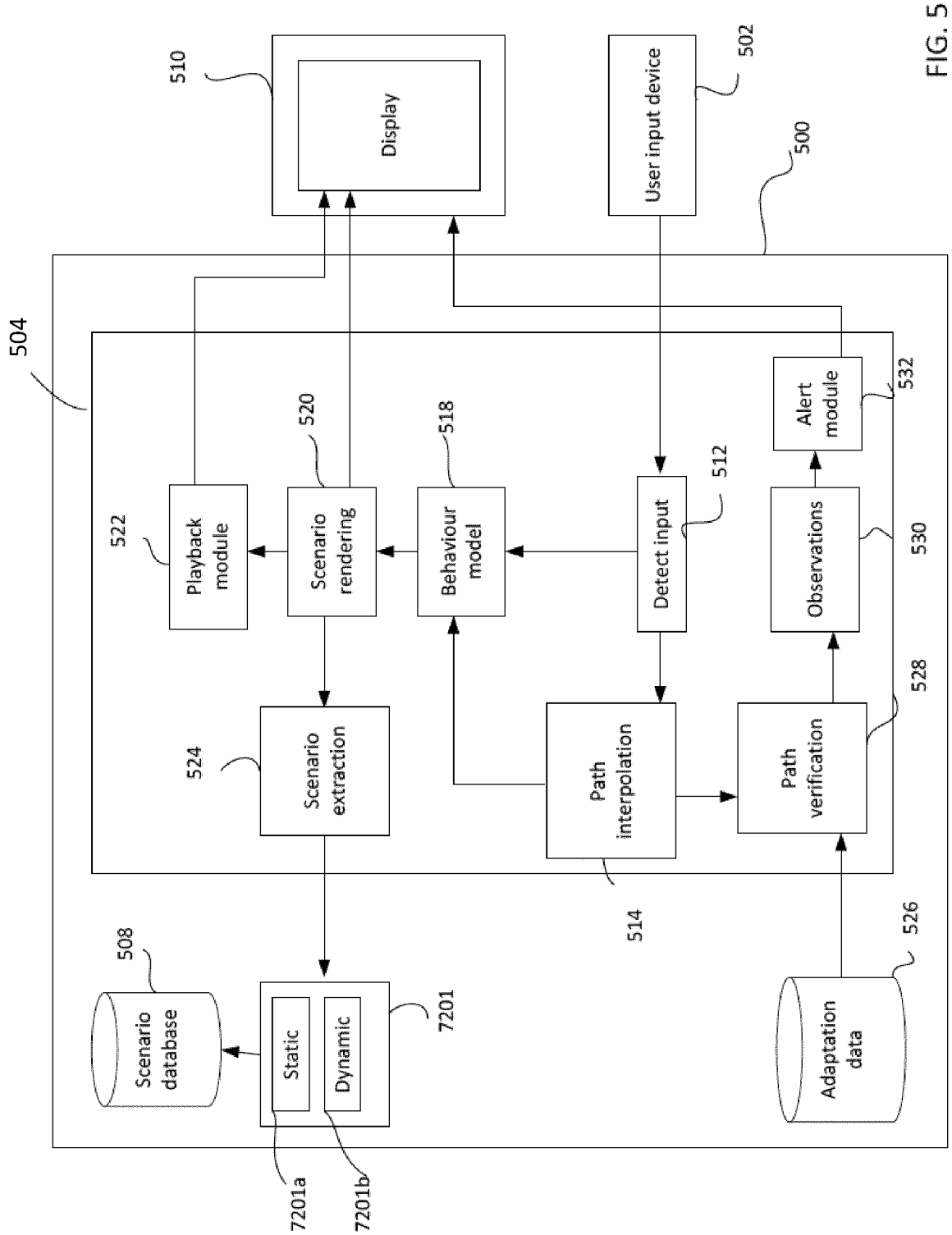
FIG. 5 is a schematic block diagram of a computer system for generating scenarios.

FIG. 5 shows a highly schematic block diagram of a computer implementing a scenario builder, which comprises a display unit 510, a user input device 502, computer storage such as electronic memory 500 holding program code 504, and a scenario database 508. The program code when executed by a suitable computer processor or processors implements multiple modules including an input detection module 512, a path interpolation module 514, a behaviour modelling module 518, a scenario rendering module 520, a scenario extraction module 524 and a playback module 522. Scenarios are visible to the user on the display 510, with the user able to adjust paths or agent behaviours using one or more user input devices 502, for example, a keyboard and mouse. The action by the user is detected by the user input device which recognises the type of action requested by the user input. If the user has moved points of a path, this data is passed to a path interpolation module 514 which computes an updated smooth path that goes through the user's selected points. If the user has made any change to the path parameters or behaviour parameters for any agent, this data is passed to the behaviour model 518. The behaviour model 518 takes in both the path and the agent behaviour parameters, and produces agent motion to be rendered within the scene in a playback mode. The scenario rendering module 520 takes in the behaviour data and renders the scene for display with the updated agents and paths. The playback module 522 takes this data and produces a scene that comprises the full motion of all the agents moving according to their defined paths and behaviours. The scenario data 7201 is extracted by a scenario extraction module 524. As described above, scenario data 7201 for each scenario comprises a static layer 7201*a*, which defines static elements of a scenario, which would typically include a static road layout and a dynamic layer 7201*b*, which defines dynamic information about external agents within the scenario, such as spatial paths an. This is exported for each scenario to a scenario database to be passed to the next stage in the pipeline 7200.

FIG. 1 shows an example of one agent defined within a scenario. In offline mode, when the scenario is edited, the ego vehicle may be present in the scene, but it does not move or interact with the agents defined for that scenario. This example scenario includes an agent vehicle 100—represented by a cuboid, and a defined path 102 on a road 104 along which the agent is constrained to travel. A feature of the present editor is that the path does not have to follow all or any portion of a road or vehicle track—it can be placed across such roads or partly on a road and partly on a pavement in the scene. For certain actor types (e.g. pedestrians) the path may be mostly off road, but may cross the road, for example at traffic lights. In a given scenario, each agent in the scene is assigned to a path 102 which constrains its direction of travel and a set of path parameters, such as starting position and speed which define its motion along the path.

As described above, the scenario description defines multiple layers which may be used by the simulator during simulation (and by the editing tool in playback mode).

There are multiple layers of configuration that determine the motion of agents of the scenario. The first layer, described above, is configured as a path in the scenario along which the agent moves. The path is defined by a set of at least four points and the speed of the agent at that point and time at which the agent reaches that point may also be configured on creating or editing the path. This layer represents the default motion of the agent, and the agent will travel along the path at the associated speeds by default if not overridden by the configuration of other layers.

A second layer instructs the agent to exhibit behaviours that may or may not override the default speeds dictated by the path points. In one example, the second layer may be configured such that the agent travels at a constant speed, irrespective of the underlying path speeds. In another example, this layer may apply a global modification factor to the speed of the agent along the path such that an agent drives along the path at 80% of the defined speeds set at the configurable path points.

A third layer of configuration includes behaviours that may be assigned to the agent that can depend on the scenario, which may override the default agent speeds set at the points of the path. As explained in more detail below, the speed of the agent may deviate from the assigned speed if the agent has been assigned an overriding behaviour which adapts according to the events of the scenario, for example according to the distance from other agents. However, the agents do not move from their defined path, irrespective of the actions of other agents in the simulation.

Both the path and the configurable behaviours of the agent may be defined by the user during scenario editing. Note that the ' path' describes a spatial trajectory for an agent, as well as path parameters such as agent position and speed at locations along the path. New agents may also be added to the scene and their behaviours defined by the user. Multiple agents may be defined to travel along a shared path. Further details on how the path is configured by a user is described below with reference to FIGS. 2A and 2B.

One reason to generate scenarios is to create events when the simulation is run which would put the ego vehicle on a collision course, so that its decision making behaviour can be assessed in such a scenario. Over recent years, autonomous driving controllers and decision making has improved to such an extent that it is becoming harder and harder to appropriate simulation scenarios of impending collisions from real life scenes. In the present scenario generation tool, scenarios may be edited to provide one or more agent, to move the agents to different starting positions and to modify agent paths and behaviour such that when a simulation is run using the scenario the ego vehicle is caused to make decisions in complex situations. For example, a scenario in which the ego vehicle is approaching a roundabout may be edited to create agents along paths so as to reduce the entry window available to the ego vehicle.

In some existing scenario generation systems, a start and end point can be defined for each agent. Decision making/routing is then used by the agent to define a path and move along it. That path cannot be defined by a user. In other existing scenario generation systems, scenarios may be imported from real life scenes. Such scenes can be marked to define the real vehicle path for conversion to a simulation scene. Such scenarios are time consuming to edit, and can require editing at a script or scenario language level.

The present scenario generation tool provides a user interface which simplifies the creation and editing of scenarios. Agent paths may be created, repositioned or otherwise modified by selecting locations on a display to mark points on the path, adjusting the positions of a set of points supporting the path or by adding new points to an existing path. For example, an agent's path may be created or adjusted so that it crosses the ego vehicle's entrance to a roundabout. A user defines a path by marking a set of these points. When the scenario is run in a simulator, the simulator constrains the motion of the agent based on the path supported by these points.

A path interpolation module in the scenario generation system generates paths based on the set of points which may be defined by the user or imported from a real-life scene. The interpolation module requires a minimum of four points to interpolate a path: two endpoints, and two intermediate points. The interpolation module uses a numerical method to obtain a curve that lies along the set of at least four points. The curve may be calculated such that it satisfies desirable mathematical properties such as differentiability and integrability. A path verification process may determine if an agent travelling along the path in the real world would adhere to kinematic and dynamic constraints.

Figure 2A:
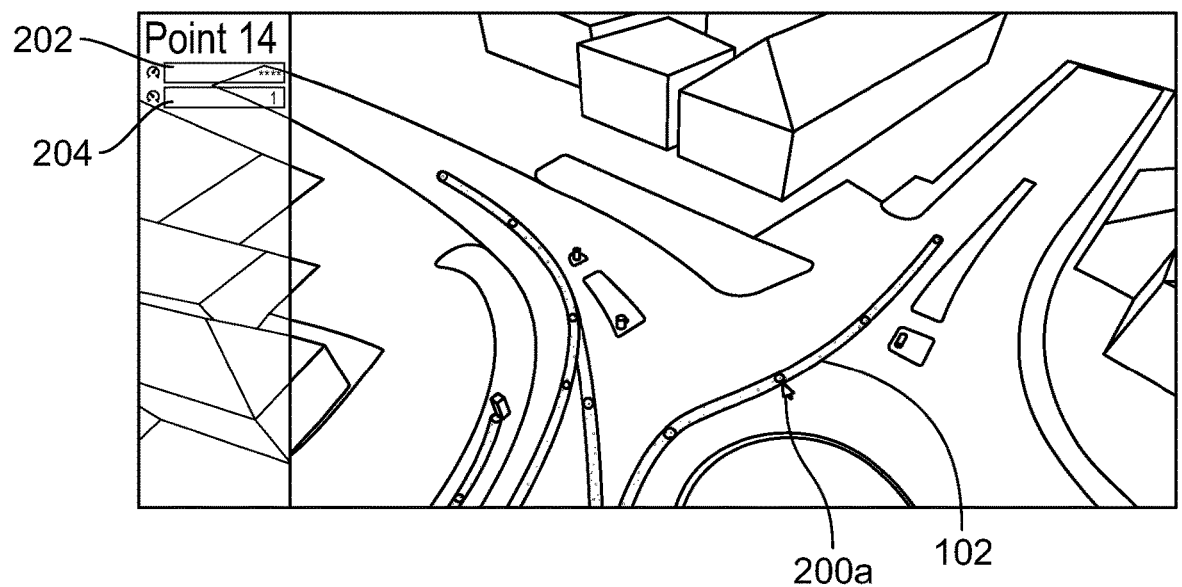
FIG. 2A shows the display of the user interface with a location marked by a user for creating the path.
Figure 2B:
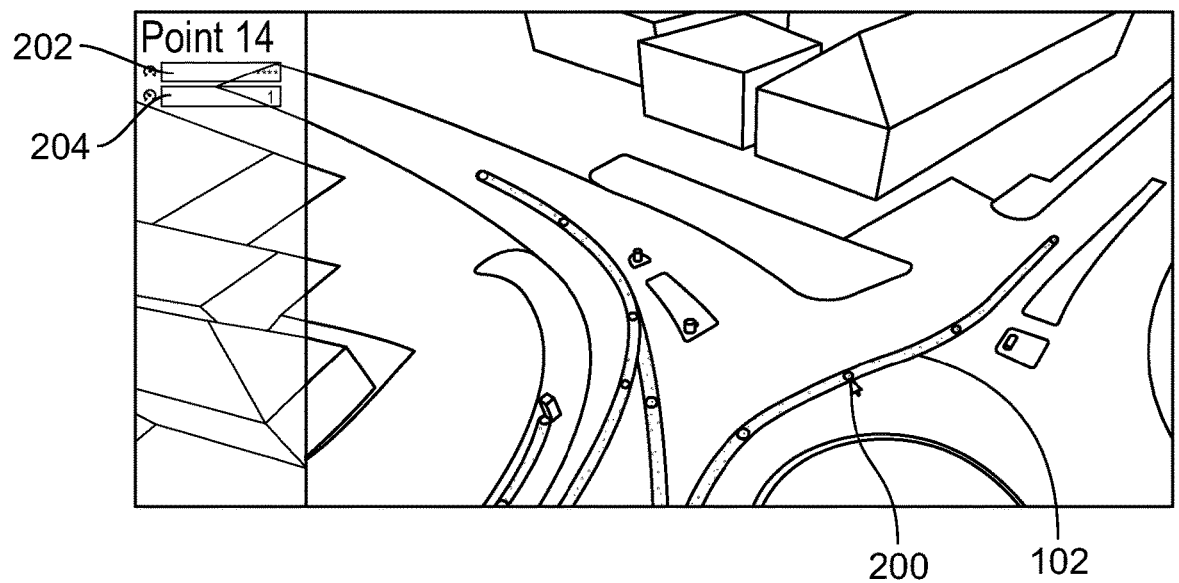
FIG. 2B shows the display of FIG. 2A indicating how a point has been moved by a user from one location to another location.

FIGS. 2A and 2B show an example of modifying the path 102 along which an agent vehicle travels. The path contains a number of points. Each point is associated with a path parameter defining the agent's motion at that point, for example the speed of the agent. The instantaneous motion of the agent is thus defined at each point and numerical methods are used to define the agent's continuous motion along the path based on these points, as described above. In FIG. 2A, one point 200 on a previously created path is shown in one location. The user can move this point to a nearby location by selecting the point, for example by dragging and dropping it using a cursor, as shown in FIG. 2B. Any suitable user input means may be used to control the display to add and move points, for example a touch screen. The path 102 is updated by the path interpolation module to run through the newly defined point position. The user may also define a new instantaneous speed 204 for the agent at the defined point, and the agent's motion along the path will be updated in response to this new speed. The configuration of parameters via the user interface is described in more detail below.

Figure 3:
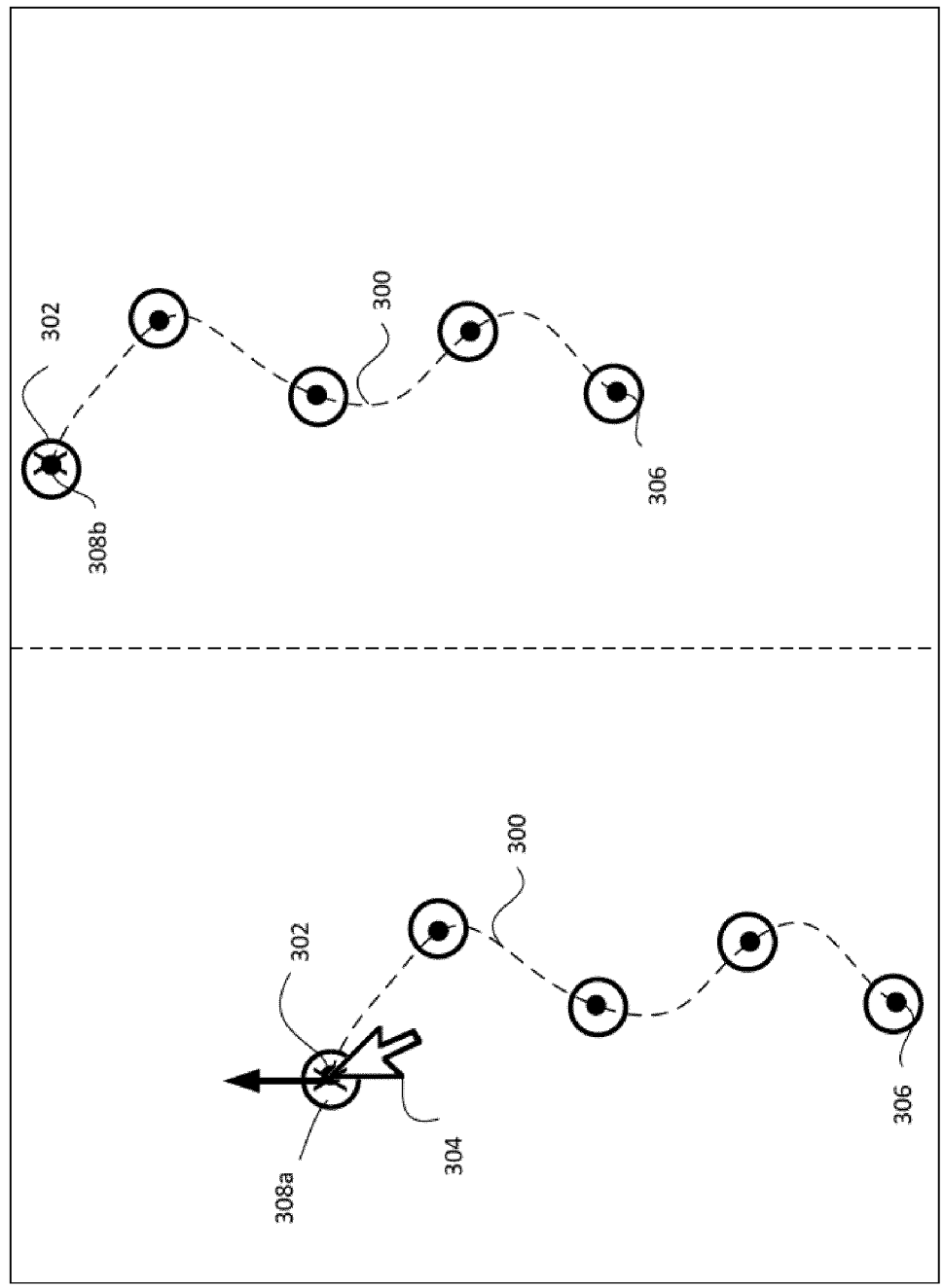
FIG. 3 illustrates how a path may be updated by moving multiple points simultaneously on the display.

The path may also be updated by moving multiple points simultaneously. An example of this is shown in FIG. 3. In this example, the user uses the cursor 304 to select all points of the path 300 between endpoints 302 and 306. The path is positioned with the endpoint 302 at location 308a. The user may use the cursor 304 to select the path 300 and drag it upwards. This has the effect of moving all selected points, and the associated length of the path 300 upwards such that the endpoint 302 is at location 308b. A path or section of path may also be selected and moved by selecting the endpoints of that section or path.

Some agent behaviours may be defined which allow parameterisation of particular variables that relate to the motion of the agent. An example of such a predefined behaviour that may be assigned to an agent is an 'Adaptive Cruise Control' (ACC) behaviour which allows parameterisation of the time or distance gap between two agents on the same driving path. The user may be presented with an interface upon selection of the ACC behaviour that allows the user to select a desired time or distance gap required between the agents. This behaviour may override the target speed determined for the given agents as a path parameter at the points along the agent's path, as mentioned above. The agent, being assigned to this predefined behaviour, may adjust its speed to ensure the requirement for distance between agents is satisfied.

Paths and behaviours are edited by the users while agents are static. A live 'playback' mode can be enabled at any time to start each agent at its defined starting position and drive along the defined path according to defined behaviours. This mode simulates the behaviour of each agent within the scenario in real time and allows the user to observe the effect of behaviour and path changes. However, the ego vehicle is not active during this playback as it is done in offline mode. The purpose of playback is to allow the user to observe the changes made to the scenario which will be presented to the ego vehicle in testing at the next stage of the testing pipeline 7200.

The scenario definition described above occurs in offline mode, and so the ego vehicle is not controlled when the scenario switches to playback mode. The ego vehicle may be present in the scenario, but it is static and is not being controlled. This is in contrast to the running of the scenario in the simulator for testing the ego vehicle behaviour—where the ego vehicle drives according to its defined behaviours and interacts with the scenario. This testing occurs at the next stage of the pipeline. The playback mode allows fine tuning of the other agents in the scenario before being exported to this next stage.

Paths and associated default speeds may be adjusted by the user via interaction with an interface which may appear upon completion of a given user action. For example, if the user clicks on a particular point of a path, an interface may appear that includes configurable fields and/or information about that point, for example the speed 204 of the given agent assigned to the path at that point and the time 202 at which this agent reaches the point assuming the agent's defined behaviour does not override the target speed and time of the agent's path (see FIG. 2A, 2B). Path parameters may be entered and adjusted in such configurable fields.

Figure 4:
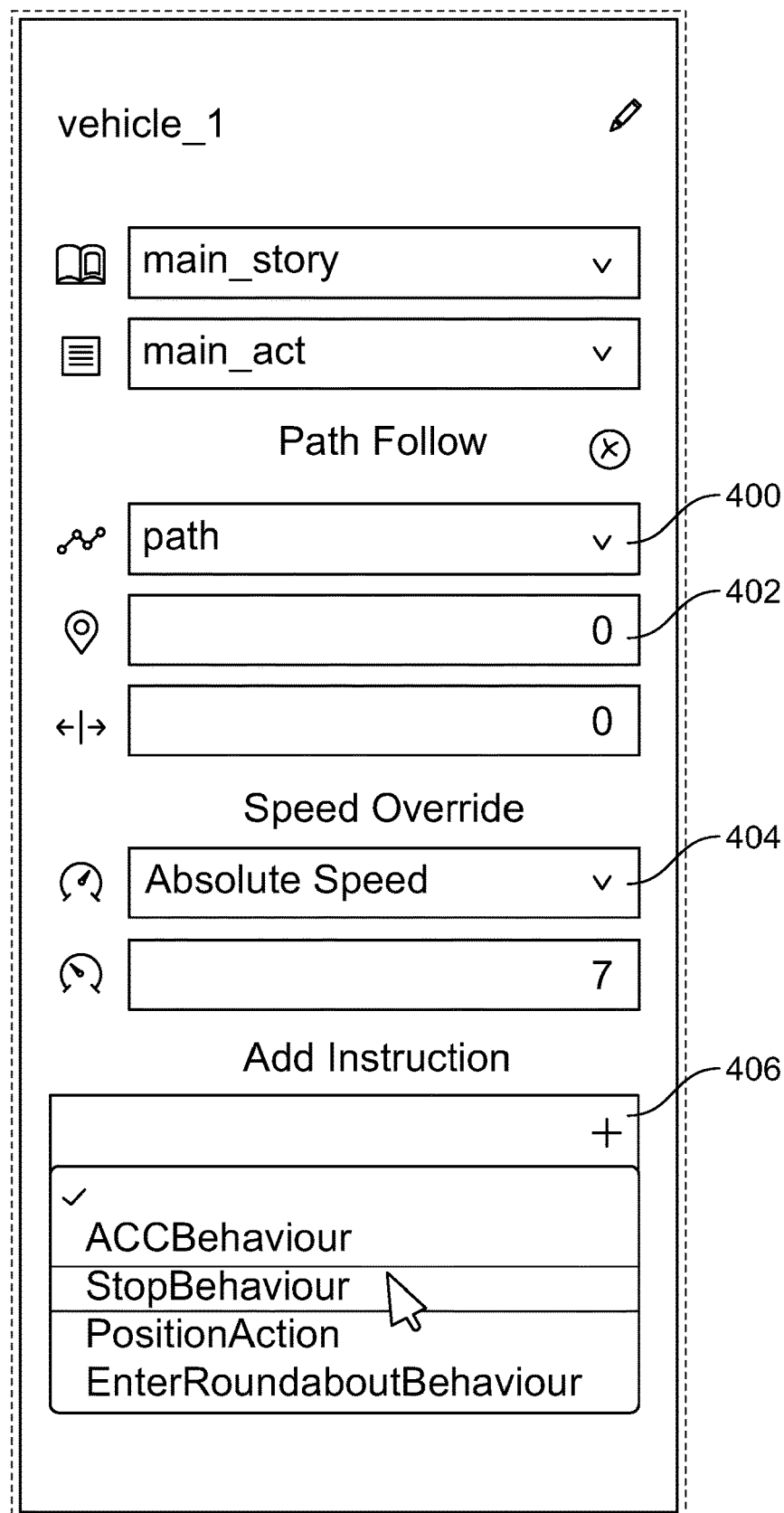
FIG. 4 illustrates an interface which may be presented on the display to indicate behaviour assigned to an agent.

A user may define an agent's behaviours by clicking on the agent itself. An example of the interface presented upon selecting an agent defined to move along a path is shown in FIG. 4. The interface that appears includes information about the agent's behaviour such as the path name 400 to which the agent has been assigned and its position 402 along that path, as well as fields that allow the user to modify that behaviour, including a field 406 to add a predefined behaviour, such as ACC (ACC Behaviour). Other fields may allow the user to change the variable 304 that defines the agent's motion, for example absolute speed.

When the paths and behaviours of the scenario have been defined and edited as desired, triggers may be set to trigger actions based on conditions which define the activation of agent behaviours. These conditions may be spatial, in which a user may define a target region within the road layout such that a given agent falling within that region triggers a predefined action associated with that target. Trigger conditions may also be temporal, where agent behaviours or other actions may be activated at predefined times in the simulation. A user may define the given condition and the action or set of actions the user wishes to activate when that condition is met. A trigger may be defined by a single condition or a set of conditions, where all conditions in the set must be true to trigger the given action.

Conditions can take multiple forms. For example, some conditions may be based on the states of agents within the scene, as in the target region example described above, where the position of the agent is used as a condition for a trigger. Other conditions may be related to values within the scene not linked to agents, such as traffic signals or temporal conditions.

An example of an action may be the activation of a certain behaviour, such as ACC, once it reaches the target region. At this point, the default driving speed dictated by the path speeds or any modifications set for the given agent may be overridden if the agent falls within the predefined distance or time threshold of another agent set by the user when defining the ACC behaviour of that agent.

Another example of an action that may be triggered by a spatial condition is the initialisation of the scenario. This may be triggered by defining a special condition for the ego vehicle, such that the agents of the scenario move from their defined starting positions along their defined paths according to their predefined behaviours only once the ego vehicle moves into a predefined target region of the road layout.

The scenario is exported to be tested at a next stage in the testing pipeline 7200 The static and dynamic layers of the scenario description are uploaded to the scenario database. This may be done via the user interface or programmatically via an API.

Kinematic Feasibility

As described above, in a scenario editing system a user can create a path in the user interface by defining a sequence of points through which the path should pass. A sequence of points may alternatively be received as user input from a user-annotated scene captured by a vehicle in a real-world environment. The points are defined by the user, and the path is interpolated using a numerical interpolation method. This method may be a centripetal Catmull-Rom spline. Each point has an associated position and target speed at which an agent is expected to travel. As discussed, the agent is not constrained to move at this speed, and it may be overridden by agent behaviours that respond to scenario conditions.

Described below is a method of creating a path from a set of points and verifying that a given path fulfils vehicle performance constraints for the given agent vehicle assigned to that path. The method allows feedback to be given to a user during editing. This method outputs a dictionary of observations for the points that violate these vehicle performance constraints.

A path interpolation module 514 receives a user input marking a sequence of points to define a path in a scene as well as target speeds for agents at each point and interpolates these points to output path data to a path verification module 528. Input data may be provided by the user marking multiple locations within a scene, providing position information for each point to create a path. The input data may be received from an annotation input from the user, annotating a scene captured by a vehicle in a real world environment. The user may mark points of a path on the captured scene as rendered within the user interface to define the path.

One method used to interpolate the path based on a sequence of points is the Catmull-Rom spline, which calculates a segment of a curve based on four points. Using a set of four points ($p_0$, $p_1$, $p_2$, $p_3$), the Catmull-Rom spline allows calculation of the path between $p_1$ and $p_2$. It possible to calculate any point on the path between these two central points, as well as the tangent at that point, the curvature at that point and arc length up to that point. Thus, the spline may be applied iteratively to subsets of the points defined by the user, which act as control points for the spline, in order to determine a full path.

The control points may correspond to the points marked by the user. Alternatively, the path generation module may generate a smoothed curve and control points from the smoothed curve may form the input to the path generation process.

An example implementation may express a point along the path between $p_1$ and $p_2$ as a cubic function of the dimensionless parameter t, which ranges from 0 to 1, where t=0 at one endpoint of the segment, in this example $p_1$, and t=1 at the other endpoint, in this example $p_2$. This function is shown in Appendix A, where the coefficients of the function are derived from the control points ($p_0$, $p_1$, $p_2$, $p_3$). The path may then be calculated for various values along the segment from $p_0$ to $p_1$ by substituting values for t ranging from 0 to 1.

The tangent at a point t may be calculated taking the derivative of the cubic function representing the path with respect to t. Again, a range of values for the tangent may be calculated by substituting a range of values for t in the resulting function for the tangent. The tangent function is defined in Appendix A.

The curvature of the path is a function of the first and second derivatives of the path, and can be calculated in a similar way, by calculating first and second derivatives of the path function with respect to t, and by substituting a range of values for t into the definition of the curvature in terms of these derivatives. The definition of these derivatives and the curvature of the path is included in Appendix A.

The arc length of the curve up to a point t may be calculated by integration of a function of the path's derivative with respect to t over a range from 0 to t. In practice, this is calculated using numerical approximation. While it is possible to numerically calculate the arc length S up to a point t, an alternative option if it is not is to do the inverse, i.e to calculate the parameter t for a given arc ratio, i.e the ratio of the arc length S up to t to the total arc length between $p_1$ and $p_2$. For a given arc ratio, the parameter t can be calculated by approximating and iteratively updating t based on the tangent of the path and the arc length. Details of this calculations can be found in Appendix A.

An example of the above values calculated for a given set of points along the path between two control points is shown in tabular form in Appendix A, comprising path positions, tangents, curvatures and arc lengths. This shows only the calculation between two example control points, $p_1$, $p_2$. The process outlined above may be repeated for all pairs of points defining the path in order to calculate the full path.

Once a path and its associated tangents and curvatures have been calculated, this data is passed to the path verification module to be verified. The verification of a path requires input data and adaptation data. Verification input data comprises the sequence of points defining the path, with associated properties of 3D position and target speed. This is processed by the interpolation module 514, as described above, and path data is further processed in the verification module. Adaptation data is also received as a user input and stored in an adaptation store 526 and passed to the path verification module. Adaptation data comprises vehicle type data such as vehicle wheel base and maximum steering angle as well as driving comfort data such as maximum turn rate, maximum lateral acceleration, maximum longitudinal acceleration. These parameters may be set by the user at certain acceptable threshold values.

Verification is implemented iteratively by using four consecutive points of the sequence of path points to compute a Catmull-Rom spline to define a path through these four points. The segment between the two mid points of this spline are then verified. To evaluate the first point of the sequence, an additional node is prepended by linearly extrapolating backwards, and to evaluate the last point of the sequence, an additional point is appended by linearly extrapolating forward. An underlying assumption of the verification is that the speed of the vehicle is interpolated linearly between control points. This allows a calculation of the longitudinal acceleration at a point $p_1$ of a set of four points ($p_0$, $p_1$, $p_2$, $p_3$), by calculating the distance travelled over a time period dT and equating this with the arc length between control points as calculated by the Catmull-Rom spline. This calculation is shown in Appendix A.

The Catmull-Rom Spline can be used to also calculate the curvature of the path at any point, including the control point $p_1$, as described above. This value can be used to determine the turning radius of the vehicle, which can further be used to calculate the steering angle needed at any point, the lateral acceleration at that point and the turn rate at that point. These calculations require a value for the wheelbase of the vehicle. Each of these calculations are shown in detail in Appendix A.

It should be noted that the above describes one example for interpolating a path and verifying the feasibility of that path for a given vehicle's motion. Other methods may be used within the above implementation to interpolate the path or calculate values for verification. While this method calculates values for adjacent points, this is not a requirement, and in other implementations, verification parameters may be calculated from the data of two non-adjacent points.

The above calculations are carried out for each point in the path, by incrementing the set of four points in the spline by one and repeating the evaluation in the path interpolation module 514, before verifying the constrained parameters in the path verification module 528. This results in a set of values for lateral acceleration, turn rate, steering angle and longitudinal acceleration, which may be compared with their maximum (threshold) values as set in the adaptation data. An example of a table of such values calculated for an example set of three control points is shown in Appendix A. If any value exceeds a maximum set by the user, this is added to a dictionary, which lists observations of constraint violations for each point of the path. This dictionary of observations may be output and saved to an observation store 530.

Constraint violations may be presented to the user in a user interface for the path editor. In this case, the nodes identified by the verification module may be displayed to the user with a flag that a relevant parameter has violated a constraint set in the adaptation data. For example, if lateral acceleration at a given point is higher than the set maximum, clicking on that point may display a flag to note that this constraint has been broken Alerts may be identified by an alert module from the set of observations 530. Alerts may be made to the user via the display 510 to notify the user that a constraint has been violated. Examples of visual alerts include colouring a node red when it has been observed to violate a constraint. Audible alerts may also be made via the user interface, in which a particular sound is played to notify the user that a constraint has been broken.

The user may edit the points on the path by dragging the point with a cursor, and the new points can be verified for their adherence to kinematic feasibility constraints by repeating the evaluation of the curve using the Catmull-Rom spline and by recalculating the relevant adaptation parameters for the new point based on the calculated curve.

In an alternative embodiment, the path verification process may cause an automatic adjustment of the path if it is does not adhere to feasibility constraints. For example, if a threshold is not met, one or more control points may be moved automatically to create a modified path, and the path verification calculations repeated to assess if the modified path meets the constraints. The process can be repeated until an automatically modified path is found that meets the constraints.

Feedback concerning kinematic feasibility may also be provided in the context of a computer system which provides an annotation tool used in training autonomous vehicles. In order for an autonomous vehicle to plan safely, it is crucial that it is able to observe its environment accurately and reliably. This includes the need for accurate and reliable detection of road structure in the vicinity of the vehicle. Hence, in the field of autonomous driving, a common requirement is to have a structure detection component (also referred to as a machine vision component) but when given a visual input can determine real-world structure such as road or lane structure, e.g. which part of the images road surface, which part of the image makes up lanes on the road, etc. This can be implemented with machine learning using convolutional neural networks. Such networks require large numbers of training images. These training images are like the images that will be seen from cameras in the autonomous vehicle, but they have been annotated with the information that the neural network is required to learn. For example, they will have annotations that marks which pixels on the image are the road surface and/or which pixels of the image belong to lanes. One technique for creating annotated training images is to have humans manually hand-annotate the images. Our earlier patent application the contents of which are herein incorporated by reference PCT/EP2019/076091 provides a system which enables road images to be accurately and semi-automatically annotated. The system annotates frames of a time sequence of frames captured by an autonomous vehicle. A three-dimensional road model is determined from an area captured in the time sequence of frames. Annotation data denoting a knows three-dimensional location of a moving object for a first frame is used to generate annotation data for marking an expected moving object location in a second frame by assuming the moving object moves along an expected path determined from the known three-dimensional location and three-dimensional road model. The annotation data which is automatically generated may be generated by moving an object annotation element (for example a cuboid or other 3D volume) from the known location in the three-dimensional space along the expected path to the expected location in three-dimensional space and geometrically projecting the object annotation element at the expected location into a two-dimensional images playing of the other image. The expected path may be determined based on a speed of the moving object and a time interval between the first and second frames. The annotation tool described in PCT/EP2019/076091 comprises a path reconstruction component which receives a sequence of captured two-dimensional images and processes them to create a three-dimensional reconstruction of the path travelled by the vehicle from the captured sequence of images. Two paths may be reconstructed in three-dimensional space. A camera path is a 3D reconstruction of the path travelled by the camera of an actual training vehicle in a physical environment. A vehicle path is a reconstruction of the path travelled by the training vehicle which is defined as the path travelled by a point defined with reference to the training vehicle and at road height. This path can be projected onto the user interface of an annotation system to provide a human annotator with the ability to view frames in a batch individually with the currently rendered lanes (of a road structure traversed by the vehicle) projected onto the images. Details of image annotation are not described further herein. What is important, however, is that the reconstructed paths may be subject to an assessment of kinematic feasibility as described here and above for scenario generation. Whether or not a reconstructed path is kinematically feasible may be indicated to a user who is using the annotation system by a visual or audible flag. This may alert them to the fact that they need to investigate further the frames that they are currently annotating.

In another embodiment, a user may mark a path in a video captured from a vehicle driving in a real world scenario. The path verification process may be executed on such a path.

APPENDIX A

Catmull-Ran Spline Calculations
Get Point at t
Using t as dimensionless parameter [0,1] to express the distance between P_1 and P_2:

$p(t)=a*t^3+b*t^2+c*t+d$ where the vectors a, b, c and d are derived from the control points P_0, P_1, P_2 and P_3 at construction of the class.
Get Tangent at t
This method calculates the tangent at the point at dimensionless distance t between P_1 and and P_2 using:

$p'(t)=3*a*t^2+2*b*t+c$

Get Curvature at t
This method calculates the curvature at the point at dimensionless distance t between P_1 P_2 using:

$p'(t)=3*a*t^2+2*b*t+c$ $p''(t)=6*a*t+2*b$ $k(t)=\|p'\times p''\|/\|p'\|^3$

Get Arc Length to t
The arc length at point t would be in theory:

$S(t)=\int_0^t sqrt(p'(t)\cdot p'(t))dt$

Since there is no closed solution, this method estimates this integral based on the Gauss quadrature approximation using Legendre-Gauss Weights of 8th order.
Get t for Arc Ratio s
Obtaining the spine parameter t for a given arc ratio s would in theory be the inverse of the integral arc integral. Since this is not possible, a simpler approach is taken to calculate the fraction s from [0,1] of the complete arc length S1 being the arc length from P1 to P2:
 start with hypothesis that s(t) is more or less a straight line, i.e. s(t)=t, i.e. the inverse is:

$t=s$ use tangent at t and extrapolate using the difference in arc length at this point, i.e. s(t), and the reference s*S1 to get a new estimate of parameter t:

$t=>t+(s*S1s-S(t))/S'(t)$ where $S'(t)=sqrt(p'(t)\cdot p'(t))dt$

Iterate until the innovation dt reaches a minimum value. The function s(t) is strictly monotonic with increasing t, so this will always converge.
Calculation of Verification Data
Longitudinal Acceleration
The underlying assumption is that the speed is interpolated linearly between the control points p1 and p2. Therefore, the distance s traveled over a period dT is on one hand the integral of the speed or time, or in this case:

$S=dT*(p1\cdot speed+p2\cdot speed)/2$

On the other hand, the same distance is the arc length s between control points p1 and p2 which can be calculated using the Catmull-Rom Spine as:

$S=spline\cdot GetArcLength(1);$

Equating both distances s results in the calculation of the time dT and consequently longitudinal acceleration a:

$dv=p2\cdot speed-p1\cdot speed;$ $dT=2*S/(p1\cdot speed+p2\cdot speed);$ $a=dv/dT$ Steering Angle
The steering angle delta needed at a point using a kinematic Ackerman model is defined with wheelbase L and turning radius R as:

tan delta=$L/R$

Given the curvature k-1/R, the steering angle can be found as delta-$a$ tan($L*k$)

This value can be compared to the maximum steering angle defined in the adaptation data.
Lateral Acceleration
The normal or lateral acceleration is defined as:

$a\_lat=p1\cdot speed^2/R$ or using the curvature k:

$a\_lat=p1\cdot speed^2*k$

This value can be compared to the maximum lateral acceleration defined in the adaptation data.
Turn Rate
Given that the turn rate is $\dot\psi=p1\cdot speed*tan\ delta$ using the definition for the steering angle above we get:

$\dot\psi=p1\cdot speed*k$

This value can be compared to the maximum turn rate defined in the adaptation data.

The invention claimed is:

1. A computer implemented method of path verification in a computer system having a user interface configured to display an image to a user and to detect user input for marking the image to generate a path, the method comprising:
receiving user input at the user interface to mark a displayed image of a scenario configured to test behavior of a vehicle in a simulated environment;
generating a path defined by the user input and representing a trajectory of the vehicle in the scenario;
recording in a computer memory control points along the path, each control point associated with a vehicle position and target speed defined by the user input;
in a processor, calculating from the vehicle position and target speed of two control points a first value of at least one path verification parameter which defines how a vehicle travelling along the path would behave;
comparing the first value of the at least one path verification parameter with a corresponding threshold value; and, based on the first value exceeding the corresponding threshold value, carrying out at least one of:
generating an alert to the user at the user interface; or
automatically modifying the path so that the threshold value is not exceeded by a second value of the at least one path verification parameter associated with the modified path; and
testing the behavior of the vehicle, wherein the testing includes simulating the behavior of the vehicle along the generated path representing the trajectory of the vehicle in the scenario.

2. The method of claim 1 wherein the step of receiving user input comprises receiving at an editing interface of the computer system user input for marking multiple locations to create the path, and the step of generating the path comprises generating at least one path which passes through the multiple locations.

3. The method of claim 2 comprising rendering the at least one path in the image which is displayed at the user interface.

4. The method of claim 1, comprising receiving user input defining adaption data for path verification, the adaption data selected from vehicle type specific data and driving comfort related data and storing the adaption data in computer storage.

5. The method of claim 4 wherein the vehicle type specific data comprises one of vehicle wheel-base and maximum steering angle.

6. The method of claim 4 wherein the driving comfort related data comprises at least one of maximum turn rate, maximum lateral acceleration and maximum longitudinal acceleration.

7. The method of claim 1, further comprising, generating and storing in computer storage at least one observation for at least one location on the path when the first value of the at least one path verification parameter exceeds the corresponding threshold value.

8. The method of claim 1, wherein the step of calculating the first value of the at least one path verification parameter comprises using four consecutive control points to produce a spline and verifying a segment between two mid-points of each spline on the path.

9. The method claim 1, wherein the at least one path verification parameter is selected from: longitudinal acceleration, curvature, steering angle, lateral acceleration, and turn rate.

10. The method of claim 1, wherein the two control points are adjacent control points.

11. The method of claim 1 wherein the step of receiving user input comprises receiving annotation input from the user at the user interface for annotating a scene captured by the vehicle in a real-world environment, and the step of generating the path comprises generating a path from scene data.

12. The method of claim 11 wherein the user is annotating motion of vehicles in a video captured by the vehicle in the real world environment and rendered on the user interface to mark the path on the user interface.

13. The method of claim 11 wherein the step of generating the path comprises generating the path from time sequenced scenes captured by the vehicle in the real world environment.

14. A computer system comprising:
one or more processors; and
computer memory comprising instructions executable by the one or more processors to implement:
a user interface configured to receive user input to mark a displayed image of a scenario configured to test behavior of a vehicle in a simulated environment;
wherein the computer memory records control points along the path, each control point associated with a vehicle position defined by the user input and target speed defined by the user input; and
wherein the one or more processors is configured to carry out the operations of:
generating a path defined by the user input and representing a trajectory of the vehicle in the scenario;
calculating from the vehicle position and target speed of two control points a first value of at least one path verification parameter which defines how a vehicle travelling along the path would behave; and
comparing the first value of the at least one path verification parameter with a corresponding threshold value; and, based on the first value exceeding the corresponding threshold value, carrying out at least on of:
generating an alert to the user at the user interface, or
automatically modifying the path so that the threshold value is not exceeded by a second value of the at least one path verification parameter associated with the modified path; and
testing the behavior of the vehicle, wherein the testing includes simulating the behavior of the vehicle along the generated path representing the trajectory of the vehicle in the scenario.

15. The system of claim 14, wherein the instructions are further executable by the one or more processors to implement an editing interface configured to receive user input for marking multiple locations to create the path, and wherein the step of generating the path comprises generating at least one path which passes through the multiple locations.

16. The system of claim 15, wherein the instructions are further executable by the one or more processors to render the at least one path in the image which is displayed at the user interface.

17. The system of claim 14, wherein the memory comprises storage for holding adaption data for path verification, the adaption data selected from vehicle type specific data and driving comfort related data and storing the adaption data in the memory.

18. The system of claim 17, wherein the driving comfort related data comprises at least one of maximum turn rate, maximum lateral acceleration and maximum longitudinal acceleration.

19. The system of claim 14, wherein the memory holds at least one observation for at least one location on the path when the first value of the at least one path verification parameter exceeds the corresponding threshold value.

20. A computer program product comprising computer executable code stored on a non-transitory computer-readable medium which, when executed by a computer carries out steps of:

receiving user input at a user interface to mark a displayed image of a scenario configured to test behavior of a vehicle in a simulated environment;

generating a path defined by the user input and representing a trajectory of the vehicle in the scenario;

recording in a computer memory control points along the path, each control point associated with a vehicle position defined by the user input and target speed defined by the user input;

in a processor, calculating from the vehicle position and target speed of two control points a first value of at least one path verification parameter which defines how a vehicle travelling along the path would behave;

comparing the first value of the at least one path verification parameter with a corresponding threshold value; and, based on the first value exceeding the corresponding threshold value, carrying out at least one of:

generating an alert to the user at the user interface; or automatically modifying the path so that the threshold value is not exceeded by a second value of the at least one path verification parameter associated with the modified path; and testing the behavior of the vehicle, wherein the testing includes simulating the behavior of the vehicle along the generated path representing the trajectory of the vehicle in the scenario.

\* \* \* \* \*